(12) United States Patent
Itabashi et al.

(10) Patent No.: US 6,322,383 B1
(45) Date of Patent: Nov. 27, 2001

(54) SOCKET FOR IC DEVICE

(75) Inventors: Katsumasa Itabashi, Tokyo; Sumiko Sakamoto, Kawaguchi, both of (JP)

(73) Assignee: Itabashi Giken Co., Ltd., Tokyo (JP)

( * ) Notice: Subject to any disclaimer, the term of this patent is extended or adjusted under 35 U.S.C. 154(b) by 0 days.

(21) Appl. No.: 09/581,015

(22) PCT Filed: Oct. 7, 1999

(86) PCT No.: PCT/JP99/05543

§ 371 Date: Jun. 6, 2000

§ 102(e) Date: Jun. 6, 2000

(87) PCT Pub. No.: WO00/28629

PCT Pub. Date: May 18, 2000

(30) Foreign Application Priority Data

Nov. 6, 1998 (JP) ................................................. 10-330251

(51) Int. Cl.[7] .................................................. H01R 13/62
(52) U.S. Cl. ............................................................ 439/331
(58) Field of Search ....................................... 439/331, 330, 439/73, 71, 266

(56) References Cited

U.S. PATENT DOCUMENTS 4,715,823 12/1987 Ezura et al. .
5,562,473 * 10/1996 Ikeya et al. ............................ 439/331
5,902,144 * 5/1999 Hay ........................................ 439/331
6,033,235 * 3/2000 Ikeya ........................................ 439/71

FOREIGN PATENT DOCUMENTS

| 0457443 A2 | 11/1991 | (EP) . |
| H5-47445 | 2/1993 | (JP) . |
| H9-121007 | 5/1997 | (JP) . |
| 10-255940 | 9/1998 | (JP) . |

* cited by examiner

Primary Examiner—Gary Paumen
(74) Attorney, Agent, or Firm—Koda & Androlia

(57) ABSTRACT

The present invention is intended to solve the problems by providing a structure comprising a cover, a base frame mounted to the cover via a coil spring, a base frame-fixing frame, boards, through-holes for contact elements, contact elements, printed circuit-fixing pins, and locking means. The locking means have locking lever-fixing shafts extending horizontally. Locking levers are pivotally mounted to the locking lever-fixing shafts, respectively. Kick springs are wound around the locking lever-fixing shafts, respectively. The locking levers have locking lever-pushing portions to form IC device-sandwiching portions. The cover is pushed to cause inner corner portions to push against the locking lever-pushing portions. Each of the contact elements has a contact element center-winding portion and contact element both side-winding portions extending from the contact element center-winding portion. The contact elements are inserted in the contact element through-holes.

1 Claim, 4 Drawing Sheets

SOCKET FOR IC DEVICE

TECHNICAL FIELD

The present invention relates to a socket for an IC device and, more particularly, to a socket used to connect the contact portions of numerous terminals of an IC device with contact portions printed on a printed circuit board. Especially, the invention relates to a socket for a leadless IC device.

BACKGROUND OF THE INVENTION

In recent years, IC devices have made transition to the leadless surface-mount type. For this purpose, IC devices assume a form adapted for the surface-mount type. That is, numerous terminal contact portions are formed without unevenness on the rear surfaces of IC devices. However, it is difficult to make electrical connections by directly making the rear surface of an IC device of this kind closely adhered to a printed circuit on a printed circuit board. Hence, a socket is necessary between the contact portions of the IC device and the contact portions of the printed circuit.

To this end, in the socket structure used for an IC device of this kind, pressure is applied between the contact portions of numerous terminals formed on the rear surface of the IC device and the printed contact portions on the printed circuit board. Since the connection is completed by the applied pressure force and by the resulting repulsive force, the pressure must be constantly applied, Therefore, the actual situation is that stable electrical connection cannot be achieved because it is impossible to apply uniform pressure to many terminals.

Accordingly, it is an object of the present invention to provide a socket which is used for an IC device and which makes electrical connections between the contact-portions of numerous terminals of a leadless IC device and the printed contact portions on a printed circuit board easily and reliably, the socket having a cover that is pushed downward to permit locking levers disposed in four directions to hold the IC device therebetween reliably in one-touch operation.

DISCLOSURE OF THE INVENTION

The present inventors have conducted investigations earnestly in view of the foregoing problem and made a structure comprising: a cover having openings in its top and bottom surfaces, respectively; a base frame having openings in its top and bottom surfaces withdrawably inserted via a coil spring in the bottom surface of the cover; a base frame-fixing frame for limiting sinking movement of the base frame; boards vertically stacked with the base frame; through-holes for contact elements penetrating the boards and the base frame; contact elements inserted in the through-holes for contact elements; fixing pins used for a printed circuit board and protruding from the bottom surface of the base frame; and locking means mounted between the cover and the base frame. The locking means have locking lever-fixing shafts extending horizontally and mounted at the four sides of the cover and the base frame. Locking levers are pivotally mounted to the locking lever-fixing shafts, respectively. Kick springs are wound around the locking lever-fixing shafts, respectively. The kick springs engage the cover and the locking levers. Each locking lever has a locking lever-pushing portion and IC device-sandwiching portions. The cover is pushed downward to cause inner corner portions to push against the locking lever-pushing portions. Each contact element comprises contact element center-winding portion fabricated by closely winding a wire into a coil and contact element both side-winding portions extending from the contact element center-winding portion. Each contact element both side-winding portion has portions closely adhered to both sides of the contact element center-winding portion and a spacing winding portion. The contact elements have both-end portions protruding and inserted into the contact element through-holes, respectively.

The action of the present invention is as follows. The contact elements each fabricated by winding a spring wire into a coil are used. The contact elements electrically connect the contact portions of numerous terminals of a leadless IC device with the printed contact portions on a printed circuit board. This assures reliable and stable connections. Further, by depressing the cover of the socket, the locking levers disposed in four directions are rotated and the IC device-sandwiching portions are released. Thus, the IC device is held between them by releasing the pressure and electrical connections are made easily.

BEST MODE FOR CARRYING OUT THE INVENTION

Figure 1:
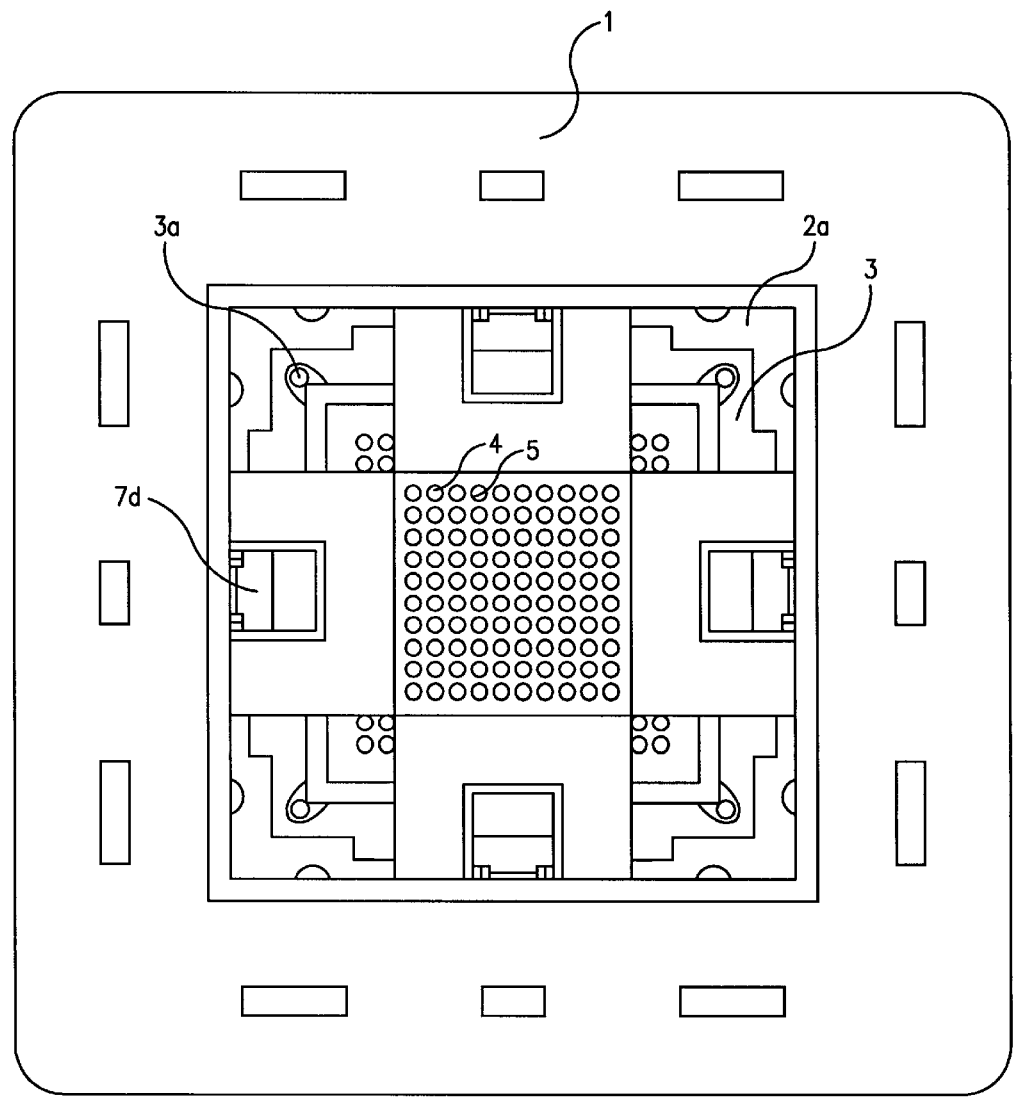
FIG. 1 is a plan view of an embodiment of an IC device socket in accordance with the present invention.

An embodiment of the present invention is hereinafter described in detail by referring to the drawings.

The present invention resides in a socket for an IC device. The socket is used to connect the contact portions of numerous terminals of the IC device with the printed contact portions on a printed circuit board. Especially, the invention pertains to a socket for a leadless IC device. The socket comprises a boxlike cover 1 having openings in its top and bottom surfaces, a boxlike base frame 2 having openings in its top and bottom surfaces withdrawably inserted via a coil spring in the bottom surface of the cover, a base frame-fixing frame 2a for limiting sinking movement of the base frame 2, boards 3 vertically stacked with the base frame 2, a number of through-holes 4 penetrating the boards 3 and the base frame 2, a number of contact elements 5 inserted in the through-holes for contact elements 4, respectively, mounting pins 6 protruding downwardly from the base frame 2 and used for mounting to the printed circuit board, and locking means 7 for the IC device. The locking means 7 are mounted between the cover 1 and the base frame 2. The locking means 7 have locking lever rotating shafts 7a, respectively, in the centers of the four sides of the cover 1 and of the base frame 2, the shafts 7a extending horizontally. Locking levers 7b are pivotally mounted to the locking lever rotating shafts 7a, respectively. Kick springs 7c are wound around the rotating shafts 7a, respectively. Both sides of each kick spring 7c engage the cover 1 described above and the locking levers 7a. Each locking lever 7a has a locking lever-pushing portion 7d. Furthermore, each locking lever 7a has an IC device-sandwiching portion 7e at its front end. The cover 1 is pushed downward to cause inner corner portions 1a to push against the locking lever-pushing portions 7d, respectively. Each of the numerous contact elements 5 comprises a contact element center-winding portion 5a fabricated by closely winding a spring wire into a coil and contact element both side-winding portions 5b that are closely adhered to both sides of the contact element center-winding portion 5a and extend from the contact element center-winding portions. Each of the contact element both side-winding portions 5b each has spirally wound portions and a spacing winding portion. Each of the numerous contact elements 5 has both-end portions protruding and inserted into the numerous through-holes for contact elements 4, respectively.

In particular, the IC device socket in accordance with the present invention is an IC device socket for electrically connecting the contact portions of numerous terminals of a leadless IC device with the same number of printed contact portions in a printed circuit of a printed circuit board. The cover 1 assumes a boxlike form having openings in its top and bottom surfaces. The IC device will be inserted into the opening in the top surface later. The base frame 2 (described later) is withdrawably inserted into the lower opening.

Sufficient space to accommodate locking means 7 (described later) is formed between the base frame 2 and the cover 1. A coil spring (not shown) is interposed between the base frame 2 and the cover 1, and the base frame 2 is inserted in the lower opening such that its lower sides can go out of the lower opening. The base frame 2 has openings in its top and bottom surfaces, respectively. The base frame-fixing frame 2a is formed under the base frame 2 to prevent the base frame 2 from coming off the cover 1.

Figure 2:
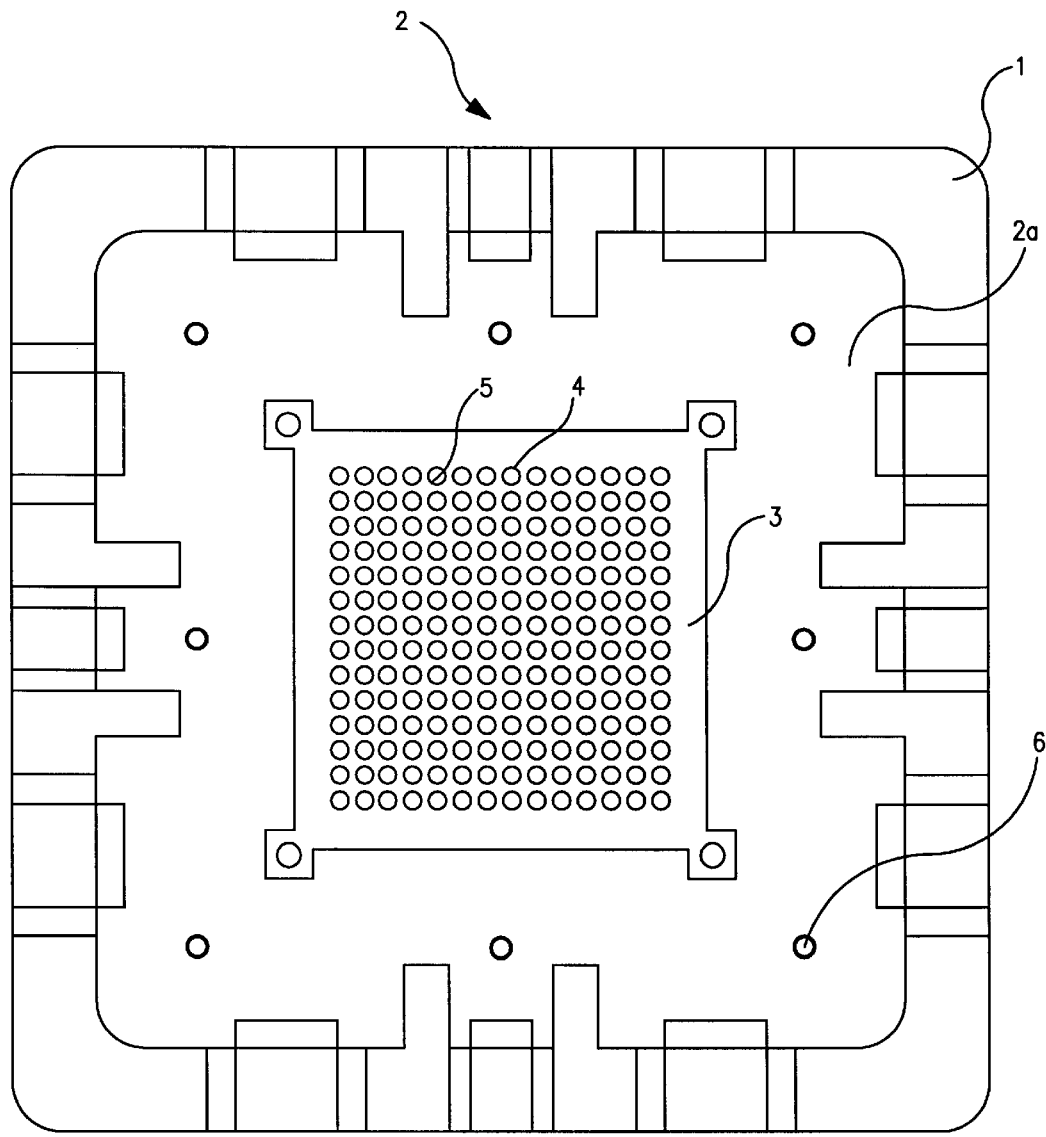
FIG. 2 is a bottom view of an embodiment of an IC device socket in accordance with the present invention.
Figure 3:
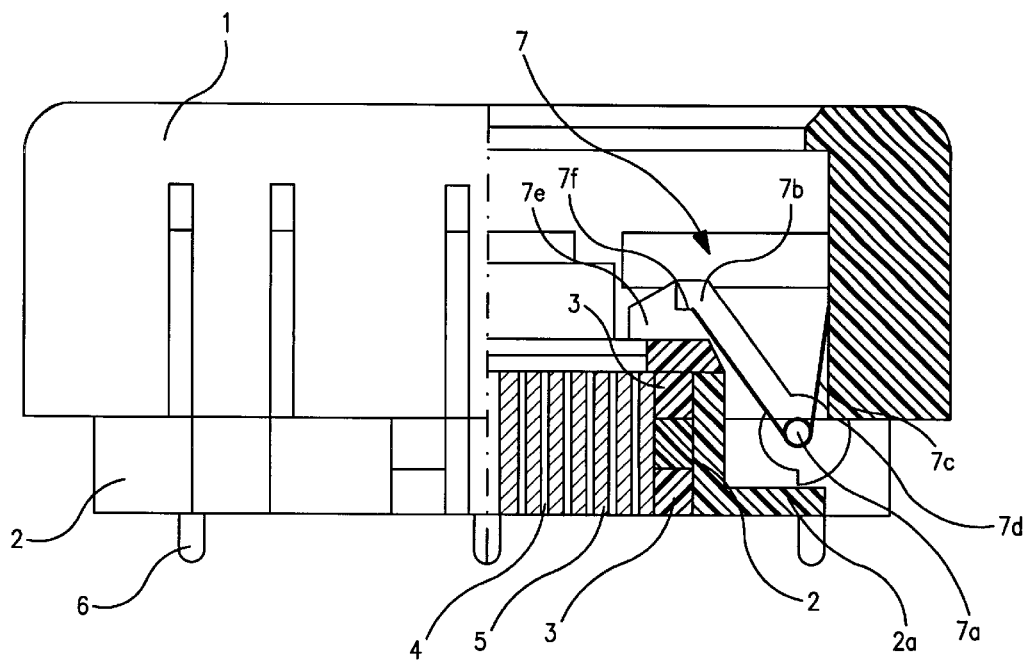
FIG. 3 is a side elevation partially in cross. section of an embodiment of an IC device socket in accordance with the present invention, illustrating a connected state.
Figure 4:
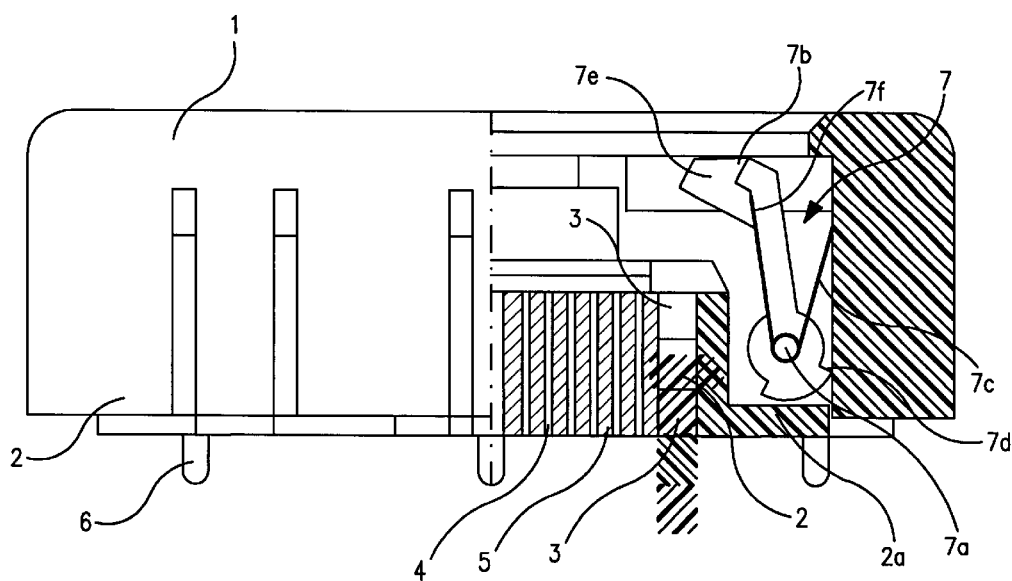
FIG. 4 is a side elevation partially in cross section of an IC device socket in accordance with the present invention, illustrating an open state.
Figure 5:
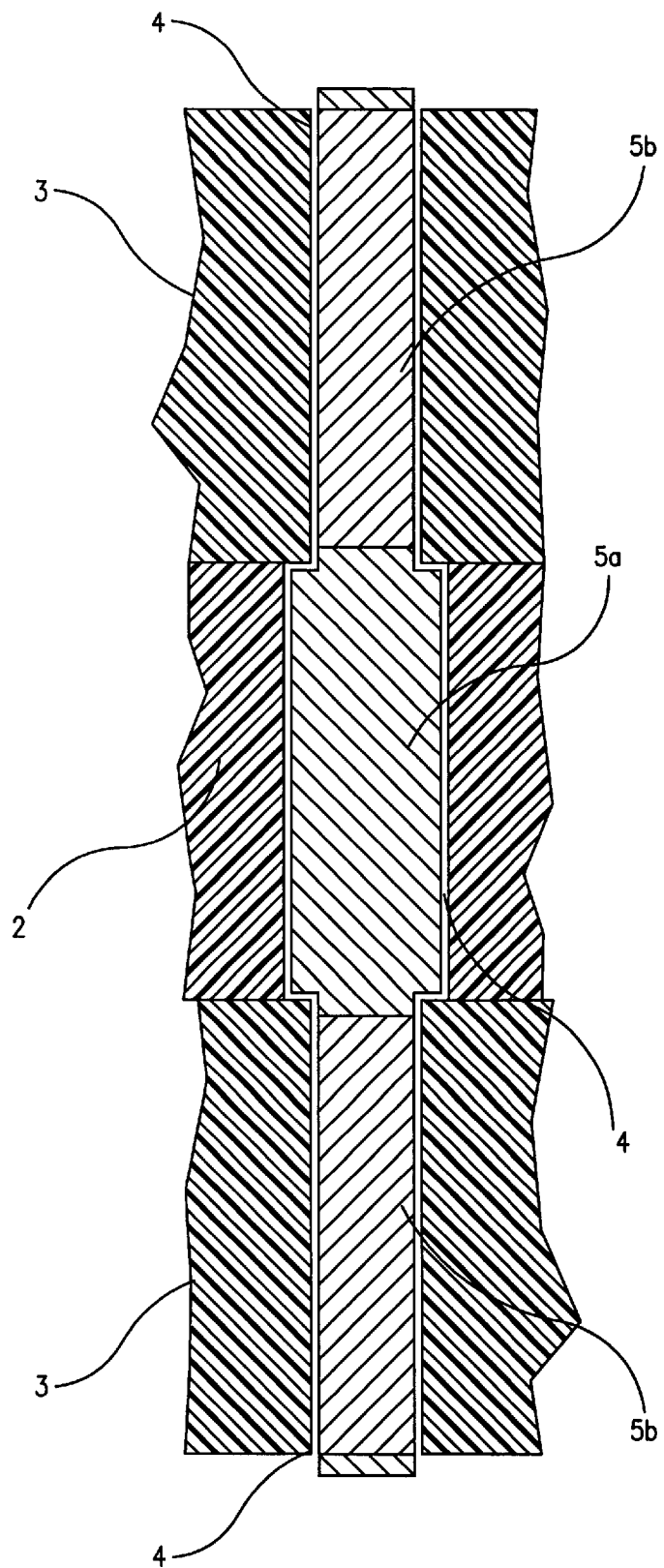
FIG. 5 is an enlarged partial side view of the contact element of the IC device socket in accordance with the present invention.

The base frame 2 is centrally provided with a number of through-holes for the contact elements 4 to penetrate the contact elements 5 (described later). Boards 3 are provided with the same number of through-holes 4 for the contact elements as the first-mentioned through-holes 4 in the identical positions. The boards 3 are vertically stacked with the base frame 2. That is, the through-holes for the contact elements 4 penetrate the three layers. In the illustrated example, 14 through-holes for the contact elements 4 are formed vertically and 14 through-holes 4 are formed horizontally as shown in FIG. 2. In total, there are 196 through-holes 4 for the contact elements. The contact elements 5 (described later) are passed through the through-holes 4. The through-holes 4 in which the contact elements 5 are inserted are exposed in the opening in the top surface of the base frame 2 and in the opening in the bottom surface. The four corners are mounted together with the boards 3 (described later) with board-locking pins 3a, thus stacking the boards 3.

A plurality of mounting pins 6 for the printed circuit board protrude below the base frame 2 and are inserted in socket-holding holes formed in the printed circuit board (not shown). The pins 6 are forced to be inserted to their respective socket-holding holes.

The locking means 7 serve to hold the IC device therebetween, and are mounted at the central portions of the four sides between the cover 1 and the base frame 2. Each locking means 7 comprises a locking lever-fixing shaft 7a and a locking lever 7b pivotally mounted to the locking lever-fixing shaft 7a. This shaft 7a extends horizontally in the space between the cover 1 and the base frame 2. That is, vertical rotation is permitted. The kick spring 7c, also called as hairspring, has a central winding portion that is wound from two to four times around the locking lever-fixing shaft 7a described above. One side of the kick spring 7c bears against the inner surface off the cover 1, while the other side bears against an arresting portion 7e of the locking lever 7. Resilience of the kick springs 7c is imparted to the cover 1 and to the locking lever 7b. Each kick spring 7c may be made of double structure.

The locking lever-pushing portion 7d engaging with the inner lower end side 1a of the aforementioned cover 1 is formed below the locking lever 7b to push the cover 1 downward, thus rotating the locking lever 7b against the resilience of the kick springs 7c. IC device-sandwiching portions 7e are formed at the front ends of the locking levers 7b to hold the substrate of the IC device from four directions therebetween, the substrate swelling like a jaw.

The numerous contact elements 5 are passed through the numerous through-holes 4 in the boards 3. Each contact element 5 has a contact element center-winding portion 5a fabricated by winding a single spring wire into a coil. The center-winding portions 5a of the elements are inserted in the contact element through-holes 4 formed in the base frame 2. Contact element both side-winding portions 5b are closely adhered to both sides of the contact element center-winding portion 5a and extend from the center-winding portion 5a. Each contact element both side-winding portion 5b has spirally wound portions and a spacing winding portion. The contact element both side-winding portions 5b are inserted in the contact element through-holes formed in the boards 3, respectively, that are vertically stacked. Both-end portions of each contact element 5 protrude from the top and bottom surfaces of the top and bottom boards 3 through the contact element through-holes 4. That is, the contact elements 5 slightly protrude from the top and bottom surfaces of the top and bottom boards 3.

The contact elements 5 are made of a spring wire fabricated from beryllium copper, copper phosphate, or copper (i.e., copper or a copper alloy). The wire is surface-treated. For example, the wire is plated with a metal such as gold, nickel, or aluminum. In the present embodiment, the diameter of the spring wire is about 0.09 mm (±0.02 mm). The spring wire has electrical conductivity and resilience.

First, the spring wire is wound into a coil to fabricate the socket center-winding portion 5a. The wire of the socket center-winding portion 5a is wound tightly and so there is no elasticity. However, it has flexibility owing to the resilience. Furthermore, adjacent coils of the spring wire are in contact with each other and electrical shorting occurs in this section. A short conductive path is formed. In the present embodiment, the coils have an outside diameter of 0.48 mm (−0.02 mm) and a length of 1.6 mm (±0.1 mm). They are inserted in the numerous (e.g., 196) contact element through-holes 4 in the boards 3.

Then, the socket both side-winding portions 5b extend from both sides of the socket center-winding portion 5a and have diameters of about 0.36 mm (±0.05 mm). An inner adhered winding portion, a spacing winding portion, an outer adhered winding portion, and a contact portion are successively formed toward the outside in each of the socket both side-winding portions 5b. The socket center-winding portions 5a are inserted in the contact element through-holes 4 formed in the center of the base frame 2. The socket both side-winding portions 5b are inserted in the contact element through-holes 4 formed in the stacked boards 3, respectively, and the top portions of the contact elements 5 are made to protrude.

That is, the inner adhered winding portions formed inside each of the socket both side winding portions 5b, extend from both sides of the socket center winding portions 5a and are closely wound at least once into a coil. The number of turns is calculated based on the weight applied. In this structure, the wire is closely wound and so there is flexibility though there is no elasticity. Furthermore, the conductive path is electrically shorted and short.

The spacing winding portions extend from the outside of the inner adhered winding portions and are wound into coils with spacing. Resilience imparts elasticity and flexibility. The elasticity takes up the pressure produced when the printed circuit board is depressed.

The outside adhered winding portions extend outwardly from the spacing winding portions, respectively, and are closely wound into coils at least once in the same way as the aforementioned inner adhered winding portions. The number of turns is computed based on the weight applied when the board is depressed. In this structure, the wire is closely wound and so there is flexibility though there is no elasticity. Furthermore, the conductive path is electrically shorted and short.

Their contact portions make contact with the contact portions of the terminals of the IC device that are at both ends of the IC device socket in accordance with the present invention. Furthermore, their contact portions make contact with the contact portions of the printed circuit on the printed circuit board. Their front ends are closed and wound. Their end portions are made horizontal to assure that they make contact easily.

In the IC device socket using the contact elements 5 and built in accordance with the present invention, the cover 1 is pushed downward to cause the inner lower end sides 1a of the cover 1 to depress the locking lever-pushing portions 7d disposed in four directions at the same time. The locking lever 7b is rotated about the locking lever rotation shaft 7a against the kick spring 7c. The rotation increases the space between the IC device-sandwiching portions 7e and the underlying board 3. Then, the IC device is mounted, and the pushing force applied from the cover 1 is relieved.

The pushing force applied from the cover 1 is relieved and thus the locking lever 7b holds the IC device between the boards 3 and the IC device-sandwiching portions 7e by the resilience of the kick spring 7c. The locking lever makes contact with the contact portions of the terminals of the IC device and with the top ends of the contact elements 5 of the IC device socket, thus making electrical connections.

A plurality of printed circuit board-mounting pins 6 protruding downward from the base frame 2 are inserted and held in holding holes formed in the printed circuit board (not shown). Thus, the pins make contact with the lower ends of the contact elements 5 protruding from the bottom board 3, thus making electrical connections.

INDUSTRIAL APPLICABILITY

In the present invention, the structure described above assures stable and reliable connections because of contact elements fabricated by winding a spring wire into a coil, the contact elements being electrically connected with the contact portions of numerous terminals of a leadless IC device and with the printed contact portions on a printed circuit board. The cover of the socket is pushed downward to rotate the locking levers that are disposed in four directions. This releases the IC device-sandwiching portions and relieves the depression. Consequently, the IC device is held and electrical connections are facilitated. In this way, the present invention is of great utility.

What is claimed is:

1. A socket for a leadless IC device equipped with a number of terminals having contact portions, said socket being adapted to electrically connect the contact portions of said terminals of said IC device with contact portions of a printed circuit on a printed circuit board, said socket comprising:

a boxlike cover having openings in its top and bottom surfaces;

boxlike base frame having openings in its top surface and bottom surfaces, said base frame having lower sides that can be withdrawably inserted via a coil spring into the opening formed in the bottom surface of said cover;

a base frame-fixing frame for limiting sinking movement of said base frame;

a top board and a bottom board stacked on said base frame;

a number of through-holes for contact elements extending through said boards and base frame;

a number of contact elements being inserted in said through-holes, respectively;

fixing pins protruding downwardly from said base frame for mounting to said printed circuit board;

locking means mounted between said cover and base frame to lock said IC device;

said locking means having locking lever rotating shafts extending horizontally, said locking lever rotating shafts being located in the central portions of four sides of each of said cover and base frame;

locking levers pivotally mounted to said locking levers, respectively;

kick springs wound around said locking lever rotating shafts, respectively, and having sides thereof engaging with said cover and locking levers, respectively;

said locking levers having locking lever-pushing portions, respectively;

said locking levers having IC device-sandwiching portions at their front ends;

means for pushing said cover downwardly to cause inner corner portions thereof to push against the locking lever-pushing portions, respectively;

each of said contact elements having a contact element center-winding portion and contact element side-winding portions, said contact element center-winding portion being fabricated by winding a spring wire closely into a coil, said contact element side-winding portions being in close contact with both sides of said contact element center-winding portion and extending from said contact element center-winding portion, each of said contact element both side-winding portions having spirally wound portions and a portion wound with spacing; and said contact elements each having side portions protruding from and inserted into said contact element through-holes formed in said contact elements.

* * * * *